United States Patent [19]

Marciniec

[11] 3,982,976

[45] Sept. 28, 1976

[54] METHOD OF EVALUATING THE CLEANLINESS OF SILICON WAFERS

[75] Inventor: Edmund T. Marciniec, Chicago, Ill.

[73] Assignee: Teletype Corporation, Skokie, Ill.

[22] Filed: Dec. 9, 1974

[21] Appl. No.: 530,637

[52] U.S. Cl. .................................. 156/7; 156/17; 252/79.1
[51] Int. Cl.² ......................................... H01L 7/50
[58] Field of Search ........... 204/129.1, 164; 29/575; 156/7, 17; 252/79.1

[56] References Cited
UNITED STATES PATENTS

| | | | |
|---|---|---|---|
| 2,927,011 | 3/1960 | Stead | 156/17 |
| 3,615,956 | 10/1971 | Irving | 156/17 |
| 3,795,557 | 3/1974 | Jacob | 156/8 |
| 3,886,005 | 5/1975 | Cota et al. | 156/17 X |

Primary Examiner—William A. Powell
Attorney, Agent, or Firm—J. L. Landis

[57] ABSTRACT

The cleanliness of silicon wafers is evaluated. At various stages of I.C. manufacture, silicon wafers may contain undesirable inorganic and organic contaminants and residues, the presence of which may be due to initial growing and slicing or to subsequent manufacturing steps such as the removal of photoresists. The present method involves differential etching of the silicon wafers. In a manner that removes silicon at a much faster rate than the contaminants and residues are removed. The differential etching is effected by subjecting the wafers to a low pressure, low temperature, RF, reactive plasma which includes a halocarbon gas, and oxygen for a time sufficient to texture the wafer. The differential etching continues at least until the onset of texturing which replicates the pattern of contaminants or residues initially present thereon for visual inspection.

11 Claims, No Drawings

METHOD OF EVALUATING THE CLEANLINESS OF SILICON WAFERS

FIELD OF THE INVENTION

This invention relates to a method of evaluating the cleanliness of silicon wafers and more particularly to a method of texturing the surface of silicon wafers in a pattern replicative of a pattern of contaminants and residues on the surface thereof, the pattern subsequently being optically or visually inspected in order to evaluate the cleanliness of the wafers.

BACKGROUND OF THE INVENTION

Generally, in manufacturing multi-layered articles, such as integrated circuits (I.C.'s), silicon wafers are subjected to various processing steps. Due to these processing steps undesirable contaminants and residues may often be introduced onto the surface of the silicon wafers. These contaminants and residues may have a deleterious effect on subsequent processing steps and may lead to the ultimate production of I.C.'s which are unusable.

One point in manufacturing where contaminants may be introduced is the point where wafers begin processing. Many I.C. manufacturers grow ingots and slice wafers therefrom; others obtain pre-sliced wafers from outside sources. Regardless of the source of the wafers, it is likely that they contain some contaminants or residues of various types at this point.

In addition, as is well known, the manufacture of I.C.'s generally includes one or more photoshaping steps in which a photoresist is applied to, selectively exposed on, selectively removed from, and then used as a mask for etching of or deposition onto, the wafers. Usually at some subsequent time such photoresist masks must be removed by stripping solutions. These stripping solutions remove the photoresist to varying degrees. To the extent that some of the photoresist remains, contaminants or residues (relative to further processing) remain on the silicon wafers.

Additionally, after photoshaping, as well as other processing steps, cleaning and rinsing steps are often involved which are intended to remove contaminants and residues. Again, to the extent that such rinsing or cleaning steps are not properly effective, contaminants or residues remain on the surface of the wafers.

Thus, the undesirable contaminants or residues which may remain on the silicon wafer include photoresists and inorganic and organic contaminants and residues.

Because a single silicon wafer may have an extremely large number of circuits formed thereon, the presence of a contaminant or residue at one or more locations does not necessarily render all of the ultimately-formed circuits unusable or unworkable. Moreover in a large I.C. manufacturing facility, many wafers may be processed over a period of time and residues or contaminants present on one or more wafers do not necessarily adversely affect circuits formed on other wafers.

Accordingly, it is desirable to possess an analytical technique which permits one to evaluate the cleanliness of a single silicon wafer. To the extent that such technique indicates that contaminants or residues are present, one may conclude that good integrated circuits may not be formed at those locations. This does not, however, mean that good circuits cannot be formed at other locations on the wafer. In fact, a convenient analytical technique may well indicate that the majority of the surface of the silicon wafer will produce good circuits as well as pinpoint where good circuits cannot be formed.

Moreover, in the situation were numerous silicon wafers are being processed, an evaluation of single wafers on a random sampling basis may be used to evaluate statistically the probability that other wafers in a given lot will or will not permit the production of good integrated circuits.

SUMMARY OF THE INVENTION

Accordingly, one object of the present invention is a method of evaluating the cleanliness of silicon wafers.

An additional object of the present invention is a method of evaluating the cleanliness of silicon wafers to detect the presence of contaminants or residues thereon.

With the above and other objects in view the present invention contemplates a method of evaluating the cleanliness of silicon wafers. Specifically this method comprises the differential etching of a silicon wafer which is presumed to contain contaminants and/or residues. This differential etching is effective in such a manner that silicon is removed at a much faster rate than the contaminants or residues are removed. Such differential etching ultimately leads to a textured pattern on the surface of the silicon wafer, the pattern being replicative of the pattern of contaminants or residues initially present thereon. The differential etching is effected by subjecting the wafer to a low or mild pressure, low temperature, RF, reactive plasma. The plasma includes a mixture of a halocarbon gas and oxygen. A preferred halocarbon is tetrafluoromethane ($CF_4$). It has been found that the use of this reactive plasma serves to differentially etch silicon at a much higher rate than the majority of different types of contaminants and residues that are typically found on the surface of silicon wafers.

DETAILED DESCRIPTION OF THE INVENTION

The present method may be used at any point in a manufacturing process wherein silicon wafers are utilized. However, the method of the present invention depends on there being sufficient exposed silicon for evaluation purposes. More specifically, the present invention is particularly useful when the majority of a silicon wafer is exposed and it is desired to evaluate the cleanliness of that wafer. The point in a manufacturing process when the method of the present invention is useful varies, as previously described, from that point at which the wafers begin the manufacturing process to any intermediate point where cleanliness of the wafer is to be evaluated.

It has been found that a mixture of a halocarbon gas and oxygen when subjected to radio frequency energy to generate a RF plasma in a mild vacuum effects the formation of a highly reactive plasma which differentially attacks the silicon at a substantially higher rate than impurities or contaminants which reside on the surface of the silicon are attacked.

Accordingly, the first step of the instant method is the placing of the silicon wafer or a part thereof in an appropriate evacuable chamber. Such a chamber may comprise a bell jar or other well known evacuable environment. The chamber is then pumped down to a mild vacuum, typically in the vicinity of one torr. Next there is admitted to the chamber a mixture of a halocarbon gas and oxygen. This mixture is permitted to pass over the wafer as radio frequency energy is applied in a well known manner to generate an RF plasma of the gas mixture.

The typical manner of applying such RF energy is by a coil which is wound around the outside of the vacuum chamber. Application of such radio frequency excites the gas molecules of the mixture and changes them into other species such as atoms, ions, free electrons and active radicals.

Because the plasma is highly reactive, silicon is etched at a low temperature typically within the range of 150°C–300°C.

A preferred halocarbon gas is tetrafluoromethane ($CF_4$), although any other halocarbon gas may be used in the mixture of oxygen if such halocarbon gas differentially etches the silicon faster than the contaminants or residues on the silicon. In this case the reactive plasma includes fluorine-based active radicals.

Preferably, differential etching is permitted to take place for a time sufficient to texture the surface of the silicon wafer with a raised pattern which replicates the pattern of any contaminants or residue which was present thereon. Of course, if the wafer is permitted to remain in the plasma for a sufficiently long time, the contaminants may well be removed by the plasma even though their rate of etch is much lower than that of silicon. Nevertheless, because at the initial stages of the differential etching, non-contaminated silicon is etched away at a much faster rate than contaminated silicon, ultimately the raised pattern will result.

Also preferably, the differential etching is permitted to continue until the raised pattern may be optically or visually observed for analytical and evaluation purposes.

After removal of the silicon wafer with the pattern thereon, the wafer may be evaluated by a variety of techniques including optical or visual observation or a surface condition monitor such as a Talysurf machine. The results of this evaluation are useful in evaluating the condition of portions of that given wafer, or, as previously described, for statistical quality control purposes where the wafer evaluated is deemed to be indicative of the quality of other wafers in the batch from which it is taken.

It should be noted that subjecting a wafer to the reactive plasma hereof, renders such wafer unusable for further processing, at least as to I.C. manufacture. This is primarily due to the large amount of silicon removed and presents no great difficulty in a statistical quality control program when the unusable wafer is one of a batch of wafers, the rest of which are potentially usable.

When a single wafer, qua wafer is being evaluated, it is necessary to examine only part thereof, if it is desired to make I.C.'s on the remainder. This is easily accomplished by scribing a break line and breaking the wafer, one portion only being subjected to the plasma. If the evaluated part indicates a reasonable statistical likelihood that the unevaluated part is capable of producing a reasonable number of I.C.'s thereon, it may be so used.

Additionally, the plasma etching of one part of a wafer permits efficient study of the nature, extent and cause of any contaminants or residues thereon. Specifically, contaminants and residues present on the wafers are often, more or less regular patterns and such as residues of photo-shaped photoresist in the configuration of a photographic negative of the first layer to be placed on the wafer, or streaks due to the spinning on or the spinning off of substances such as photoresist, rinses and cleaners. If such a pattern is observed on the plasma etched part of the wafer, it is a simple matter to match the two parts back up and extrapolate just where on the unetched part contaminants may be. Then these locations may be either minutely examined and tested electrically, microscopically and chemically or avoided in I.C. manufacture.

EXAMPLE

In one example a silicon wafer was placed in a boat which was then loaded into a quartz reaction chamber. The chamber was evacuated to a mild vacuum of approximately one torr and a mixture of oxygen, and tetrafluoromethane ($CF_4$) was admitted through a needle valve into the reaction chamber and passed over the silicon wafer.

The ratio of the tetrafluoromethane ($CF_4$) to oxygen was 93:7.

Radio frequency power was applied to a coil surrounding the chamber to excite the gas molecules in the mixture and to generate the highly reactive, low temperature plasma. Low temperature etching of the silicon wafer at temperatures between 150°C–300°C took place in which the silicon was removed at a substantially higher rate than were the contaminants and residues present on the surface of the wafer. The wafer was permitted to remain in the plasma for 10 minutes and was then removed for optical and visual analysis. The raised pattern was clearly visible and indeed was found to replicate the contaminant pattern thereon. Generally etching is permitted to occur for 6–15 minutes.

It should be noted that the plasma of the present invention is intentionally designed to attack silicon. In this way it differs from plasma such as those disclosed in U.S. Pat. No. 3,806,365 in which a halocarbon gas, specifically trichlorotrifluoroethane ($C_2Cl_3F_3$), is mixed with trichloroethylene ($ClCH:CCl_2$) and oxygen. This formulation disclosed in the patent generates a plasma which is intentionally designed to not attack the silicon or to attack silicon minimally and to maximize the removal by the plasma of contaminants or residues on the surface of the silicon. These contaminants are the same ones the present method is intended to not remove or to remove minimally.

It is not fully understood why one halocarbon gas mixture, such as that of the 3,806,365 patent; preferentially attacks contaminants and residues, while another halocarbon, such as the tetrafluoromethane ($CF_4$) plus oxygen of this invention preferentially attacks silicon. Moreover, the use of the plasma of the present invention effects differential etching of silicon, and substantially does not attack any of a wide variety of contaminants and residues thereon. That is, regardless of their composition or source, and regardless of whether they are organic or inorganic, contaminants are observed to be not removed or to be removed extremely slowly by the present method. This latter effect is also not fully understood.

Although only one example of the invention is described in the foregoing specification, it will be understood that the invention is not limited to the specific embodiment described, but is capable of modification and rearrangement and substitution of materials without departing from the spirit of the invention.

What is claimed is:

1. A method of texturing the surface of a silicon wafer with a pattern replicative of a pattern of undesirable contaminants thereon comprising the steps of:
   a. placing the wafer in a mild vacuum; and then
   b. subjecting the wafer to a reactive, RF plasma which includes a mixture of a halocarbon gas and oxygen until a raised pattern replicative of the contaminant pattern is visible on the surface.

2. The method of claim 1 wherein the halocarbon gas is tetrafluoromethane ($CF_4$).

3. The method of claim 2 wherein the ratio of the tetrafluoromethane ($CF_4$) to oxygen is 93:7.

4. The method of claim 3 wherein the mild vacuum is approximately 1 torr.

5. The method of claim 4 wherein the plasma temperature is between 150°C–300°C.

6. A method of evaluating the cleanliness of a silicon wafer by differentially etching the silicon and contaminants thereon to remove substantially more silicon per unit time at those places on the wafer where the contaminants are not present, thereby texturing the wafer with a raised pattern replicative of the pattern of contaminants comprising the step of:
   subjecting the wafer to a low pressure, low temperature, RF, reactive plasma including a halocarbon gas and oxygen for a time sufficient to texture the wafer.

7. The method of claim 4 wherein the wafer remains in the plasma until the texturing is visually detectable.

8. The method of claim 7 wherein the halocarbon gas is tetrafluoromethane ($CF_4$).

9. The method of claim 8 wherein the ratio of the tetrafluoromethane ($CF_4$) to oxygen is 93:7.

10. The method of claim 9 wherein the low pressure is approximately 1 torr.

11. The method of claim 10 wherein the plasma temperature is between 150°C–300°C.

* * * * *